(12) United States Patent
Yang et al.

(10) Patent No.: US 9,166,020 B2
(45) Date of Patent: Oct. 20, 2015

(54) METAL GATE STRUCTURE AND MANUFACTURING METHOD THEREOF

(75) Inventors: Chan-Lon Yang, Taipei (TW); Chi-Mao Hsu, Tainan (TW); Chun-Yuan Wu, Yunlin County (TW); Tzyy-Ming Cheng, Hsinchu (TW); Shih-Fang Tzou, Hsinchu County (TW); Chin-Fu Lin, Tainan (TW); Hsin-Fu Huang, Tainan (TW); Min-Chuan Tsai, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 436 days.

(21) Appl. No.: 13/037,383

(22) Filed: Mar. 1, 2011

(65) Prior Publication Data

US 2012/0223397 A1 Sep. 6, 2012

(51) Int. Cl.
| | |
|---|---|
| *H01L 29/78* | (2006.01) |
| *H01L 21/28* | (2006.01) |
| *H01L 29/66* | (2006.01) |
| *H01L 29/49* | (2006.01) |
| *H01L 29/51* | (2006.01) |
| *H01L 29/165* | (2006.01) |

(52) U.S. Cl.
CPC ...... *H01L 29/6659* (2013.01); *H01L 21/28088* (2013.01); *H01L 29/4966* (2013.01); *H01L 29/517* (2013.01); *H01L 29/66545* (2013.01); *H01L 29/7833* (2013.01); *H01L 29/165* (2013.01); *H01L 29/665* (2013.01); *H01L 29/66636* (2013.01); *H01L 29/7843* (2013.01)

(58) Field of Classification Search
USPC .......... 257/311, 328, 350, 411, E21.158, 257/E27.103, E29.255; 438/157, 283, 591
See application file for complete search history.

(56) References Cited

U.S. PATENT DOCUMENTS

| | | | |
|---|---|---|---|
| 6,066,533 | A | 5/2000 | Yu |
| 6,492,217 | B1 | 12/2002 | Bai |
| 6,552,377 | B1 | 4/2003 | Yu |
| 6,696,345 | B2 | 2/2004 | Chau |
| 7,030,430 | B2 | 4/2006 | Doczy |
| 7,074,664 | B1 | 7/2006 | White |
| 7,109,079 | B2 | 9/2006 | Schaeffer, III |
| 7,126,199 | B2 | 10/2006 | Doczy |
| 7,208,366 | B2 | 4/2007 | Tsai |
| 2002/0127888 | A1 | 9/2002 | Cho |
| 2005/0095763 | A1 | 5/2005 | Samavedam |
| 2006/0040482 | A1 | 2/2006 | Yang |
| 2007/0082445 | A1 | 4/2007 | Yang |
| 2007/0148838 | A1 | 6/2007 | Doris |
| 2007/0210354 | A1 | 9/2007 | Nabatame |
| 2008/0157212 | A1* | 7/2008 | Lavoie et al. ............... 257/369 |
| 2008/0224236 | A1* | 9/2008 | Ren et al. ................... 257/407 |
| 2008/0318371 | A1 | 12/2008 | Lin |
| 2009/0057787 | A1 | 3/2009 | Matsuki |
| 2010/0052070 | A1* | 3/2010 | Chung et al. ................ 257/369 |
| 2010/0052074 | A1 | 3/2010 | Lin |
| 2010/0127336 | A1* | 5/2010 | Chambers et al. .......... 257/369 |
| 2010/0234975 | A1* | 9/2010 | Wu et al. .................... 700/105 |
| 2011/0006354 | A1 | 1/2011 | Jangjian |

\* cited by examiner

*Primary Examiner* — Lynne Gurley
*Assistant Examiner* — Vernon P Webb
(74) *Attorney, Agent, or Firm* — Winston Hsu; Scott Margo

(57) ABSTRACT

A method for manufacturing a metal gate structure includes providing a substrate having a high-K gate dielectric layer and a bottom barrier layer sequentially formed thereon, forming a work function metal layer on the substrate, and performing an anneal treatment to the work function metal layer in-situ.

8 Claims, 5 Drawing Sheets

METAL GATE STRUCTURE AND MANUFACTURING METHOD THEREOF

BACKGROUND OF THE INVENTION

1. Field of the Invention

The invention relates to a metal gate structure and a manufacturing method thereof, and more particularly, to an n-type metal gate structure and a manufacturing method thereof.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

According to an aspect of the present invention, there is provided a metal gate structure. The metal gate structure includes a high-K gate dielectric layer, a bottom barrier layer formed on the high-K gate dielectric layer, a titanium tri-aluminide (TiAl$_3$) work function metal layer formed on the bottom barrier layer, a top barrier layer formed on the TiAl$_3$ work function metal layer, and a low-resistance metal layer formed on the top barrier layer.

According to another aspect of the present invention, there is provided a method for manufacturing a metal gate structure. The method includes providing a substrate having a high-K gate dielectric layer and a bottom barrier layer sequentially formed thereon, forming a work function metal layer on the substrate, and performing an anneal treatment to the work function metal layer in-situ.

According to the metal gate structure and the method for manufacturing a metal gate structure provided by the present invention, the anneal treatment is in-situ performed to induce a phase transformation of the work function metal layer to form a TiAl$_3$ work function metal layer and simultaneously to improve Al diffusion and thus the work function of the metal gate structure is tuned to an ideal value: 3.9-4.3 eV. In other word, the method for manufacturing a metal gate structure is performed to provide a metal gate structure having superior reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for manufacturing a metal gate structure provided by a first preferred embodiment of the present invention; wherein FIG. 4 is a schematic drawing illustrating a modification to the first preferred embodiment.

DETAILED DESCRIPTION

Figure 1:
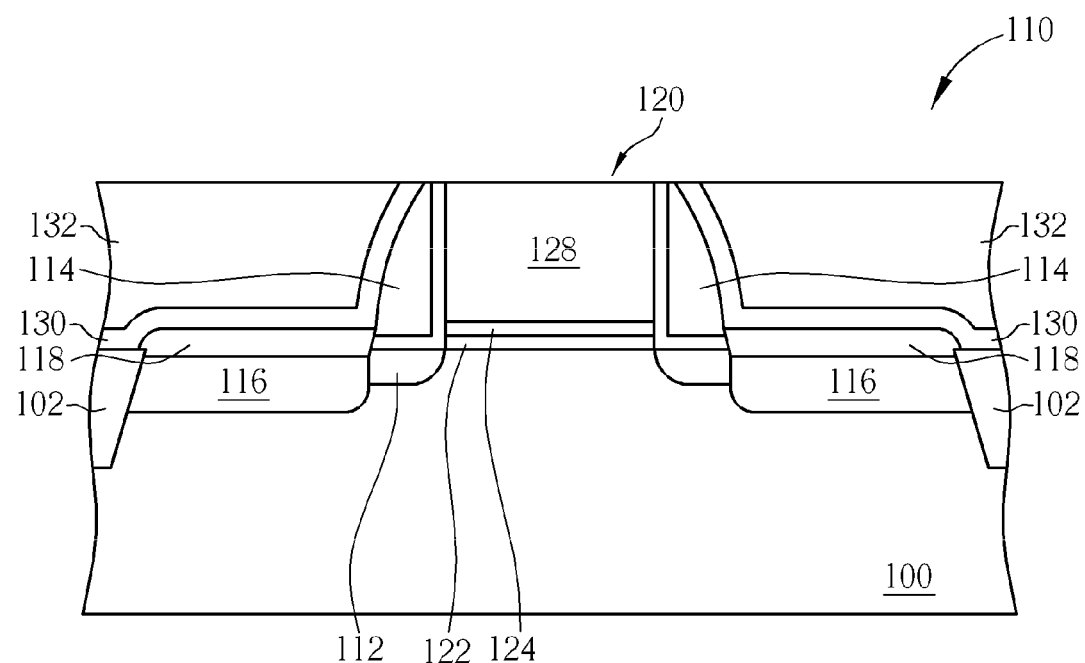

Please refer to FIGS. 1-7, which are schematic drawings illustrating a method for manufacturing a metal gate structure provided by a first preferred embodiment of the present invention. It is noticeable that the preferred embodiment is performed with the gate-last process. As shown in FIG. 1, a substrate 100 such as a silicon substrate, a silicon-containing substrate, or a silicon-on-insulator (SOI) substrate is provided, and a plurality of shallow trench isolations (STIs) 102 is formed in the substrate 100 for providing electrical isolation. Then, at least a semiconductor device 110 is formed on the substrate 100. The semiconductor device 110 includes a gate structure 120, and the gate structure 120 includes a gate dielectric layer, a titanium nitride (TiN) layer 124, a dummy gate 128 such as a polysilicon layer, and a patterned hard mask (not shown). The abovementioned layers are upwardly and sequentially formed on the substrate 100. The TiN layer 124 serves as an etch stop layer and a bottom barrier layer. Furthermore, the gate structure 120 also includes an interfacial layer (not shown) formed prior to the gate dielectric layer. It is noteworthy that the preferred embodiment is integrated with the high-K first process, accordingly the gate dielectric layer includes a high-K gate dielectric layer 122, which includes materials selected from the group consisting of hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), and hafnium zirconium oxide (HfZrO$_4$).

Please still refer to FIG. 1. The semiconductor device 110 further includes light doped drains (LDDs) 112. Since the semiconductor device 110 provided by the preferred embodiment is an n-type semiconductor device, the LDDs 112 are an n-type LDDs. The semiconductor device 110 further includes a spacer 114 formed on sidewalls of the gate structure 120, and the spacer 114 is preferably a multi-layered structure. The semiconductor device 110 further includes an n-type source/drain 116 and silicides 118 for reducing resistance formed on the source/drain 116. Additionally, selective epitaxial growth (SEG) method can be utilized to form the source/drain 116 in the preferred embodiment. As mentioned above, since the semiconductor device 110 is an n-type semiconductor device, epitaxial silicon layers with silicon carbide (SiC) can be used to form the n-type source/drain 116. Furthermore, there are a contact etch stop layer (CESL) 130 and an inter-layer dielectric (ILD) layer 132 sequentially formed on the semiconductor device 110 and the substrate 100. Since steps for forming the gate structure 120, the LDDs 112, the spacer 114, the source/drain 116, the silicides 118, the CESL 130 and the ILD layer 132 are well-known to those skilled in the art, those details are omitted herein in the interests of brevity.

Figure 2:
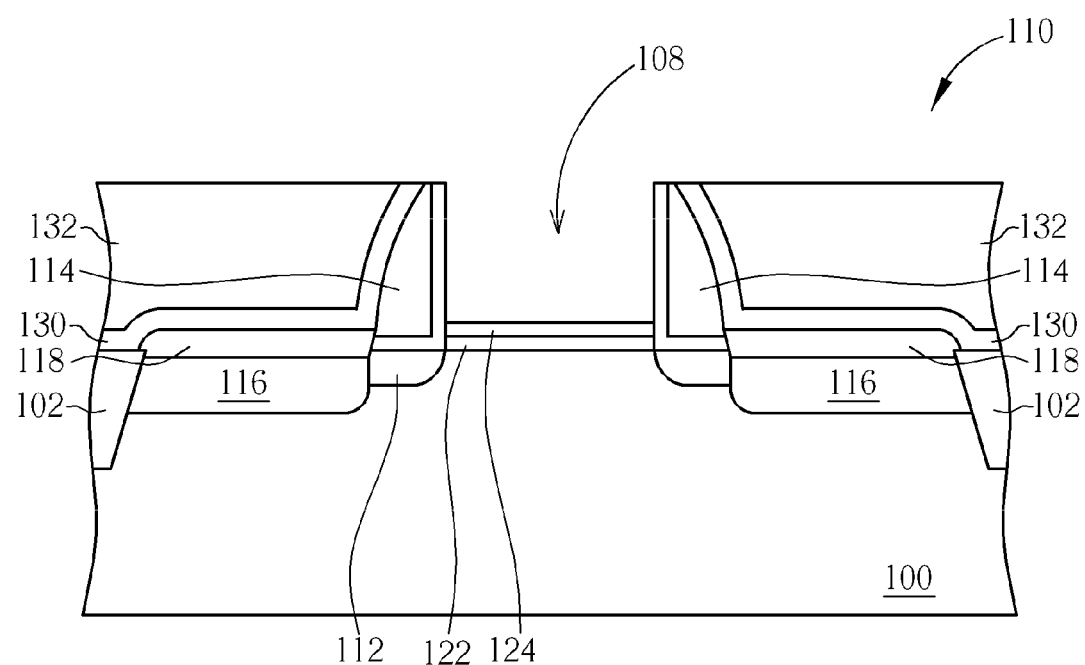

Please refer to FIG. 1 and FIG. 2. Next, a planarization process is performed to remove a portion of the ILD layer 132, a portion of the CESL 130, and the patterned hard mask. Consequently the top of the dummy gate 128 is exposed. Then, an etching process is performed to remove the dummy gate 128 to form a gate trench 108. As mentioned above, the TiN layer 124 serves as an etch stop layer, therefore the TiN layer 124 is exposed in the gate trench 108 after removing the dummy gate 128 as shown in FIG. 2. Accordingly, the high-K gate dielectric layer 122 is protected from the etching process by the TiN layer 124.

Figure 3:
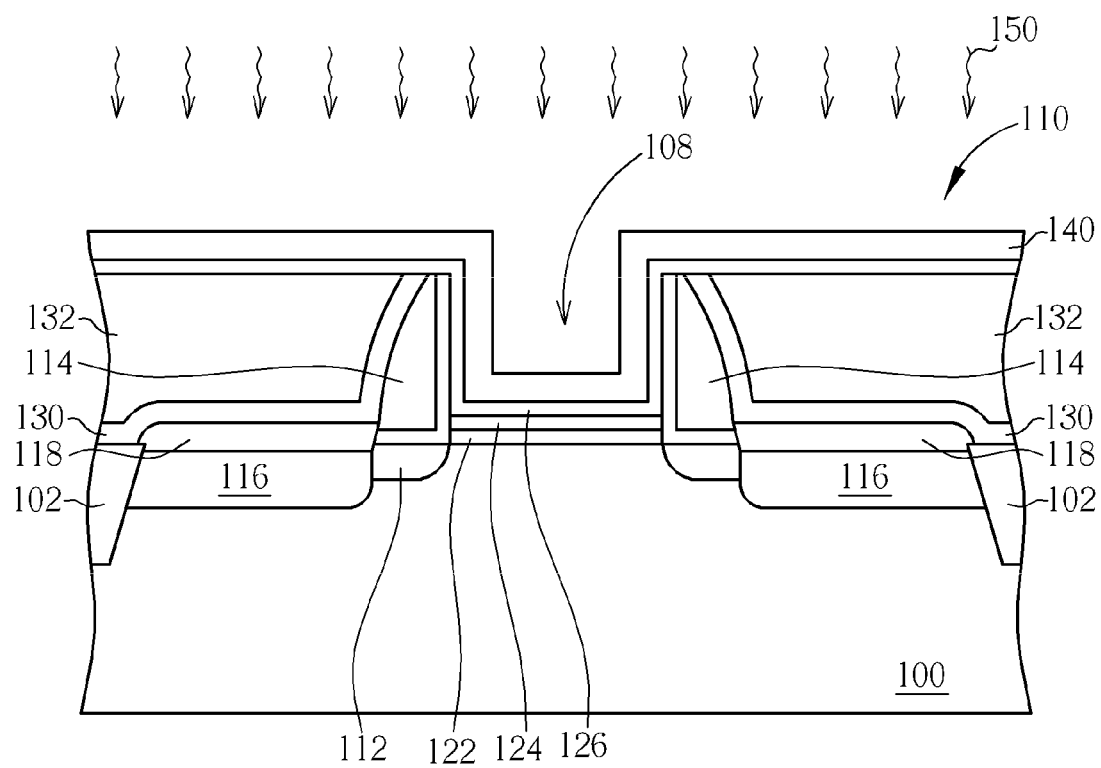

Please refer to FIG. 3. After forming the gate trench 108, a tantalum nitride (TaN) layer 126 and a titanium aluminide (TiAl) layer 140 are sequentially formed on the substrate 100 and in the gate trench 108. Please note that the TaN layer 126 and the TiN layer 124 both serve as the bottom barrier layer while the TiAl layer 140 serves as a work function metal layer. In the preferred embodiment, the TiAl layer 140 is a single-layered structure. Please refer to FIG. 4, which is a schematic drawing illustrating a modification to the first preferred embodiment. According to the modification, the work function metal layer 140 is a bi-layered structure, and the bi-layered structure includes a Ti/Al bi-layered structure as shown in FIG. 4.

Figure 4:
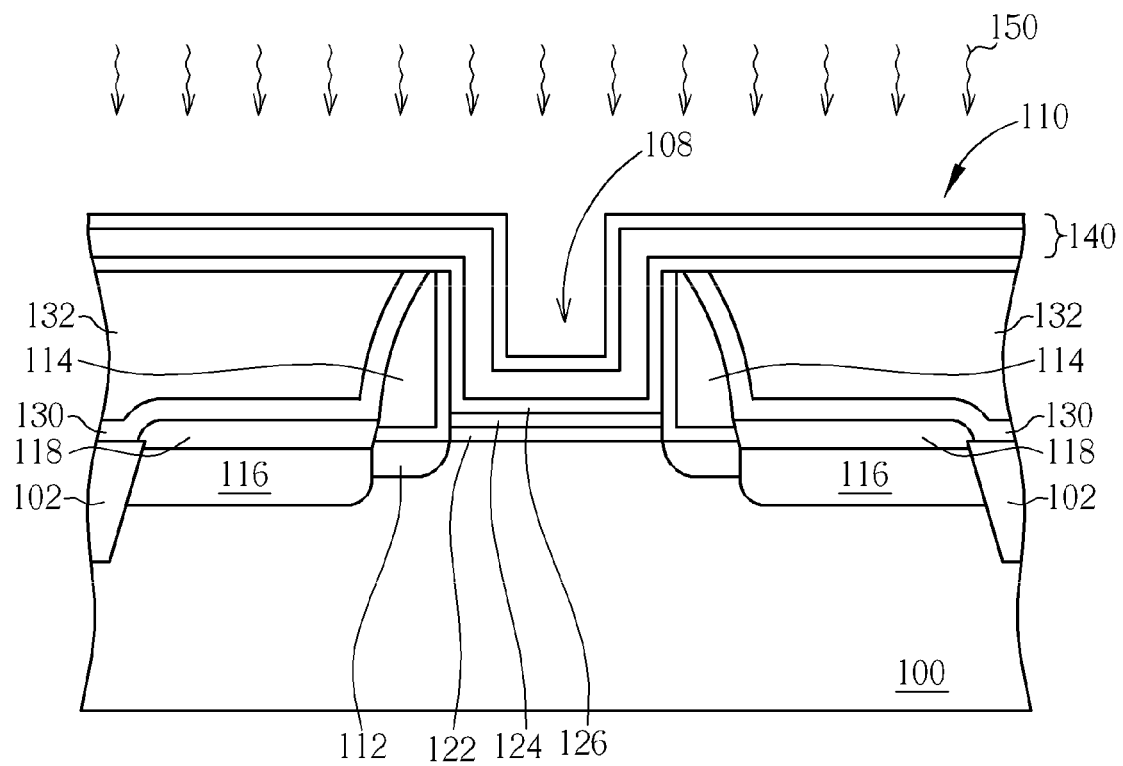

Please refer to FIG. 3 and FIG. 4. It is noteworthy that during forming the work function metal layer, that is the TiAl layer 140 or the Ti/Al bi-layered structure 140, the work function metal layer 140 is formed in a vacuum environment. After forming the TiAl layer 140, an anneal treatment 150 is in-situ performed to the work function metal layer 140 without removing the vacuum environment. In other words, the step of forming the work function metal layer 140 and the step of performing the anneal treatment 150 are in-situ performed in a vacuum environment. In the preferred embodiment, the anneal treatment 150 is performed at a temperature between 400° C. and 460° C., and in a duration between 2 minutes and 10 minutes. The anneal treatment 150 includes a rapid thermal process (RTP), a Laser-spike annealing, or a furnace, but not limited to this. In addition, the anneal treatment 150 further includes introducing inert gas such as argon (Ar). However, the anneal treatment 150 is performed without introducing any oxygen-containing gas.

Figure 5:
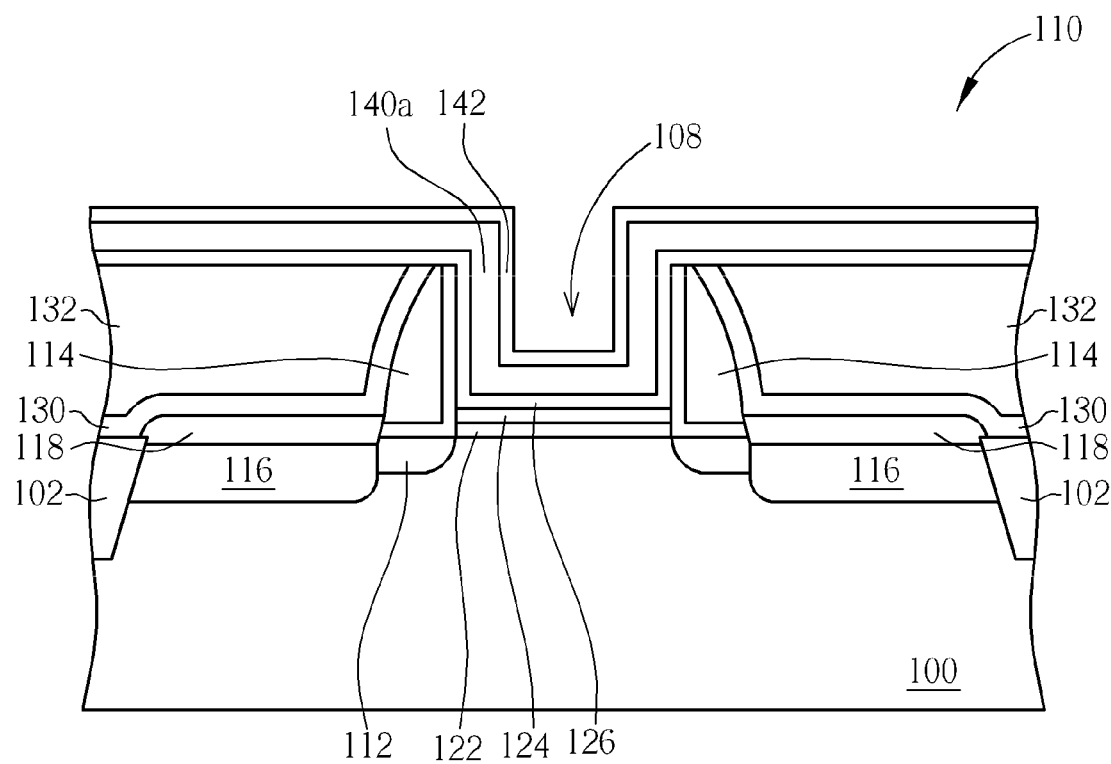

Please refer to FIG. 5. It is noteworthy that the anneal treatment 150 is performed to the work function metal layer 140 to induce a phase transformation from the TiAl layer 140 to a titanium tri-aluminide (TiAl$_3$) layer 140a. When the anneal treatment 150 are not in-situ performed or not performed in this timing, such as phase transformation would not happen. More important, during the phase transformation from the TiAl work function metal layer 140 to the TiAl$_3$ work function metal layer 140a, aluminum (Al) in the aforementioned layer diffuses to the interface between the TiN layer 124 and the high-K gate dielectric layer 122 and finally arrives at the surface of the high-K gate dielectric layer 122. Simultaneously, work function of the gate structure is tuned. Accordingly, by in-situ performing the anneal treatment 150, Al diffusion is improved, and work function of the n-type gate is tuned to an ideal value: 3.9-4.3 eV. Furthermore, since the anneal treatment 150 is performed without removing the vacuum environment, the TiAl layer 140 is avoided from contacting the air, and thus is prevented from forming oxide or nitride that seriously deteriorates the performance.

Figure 6:
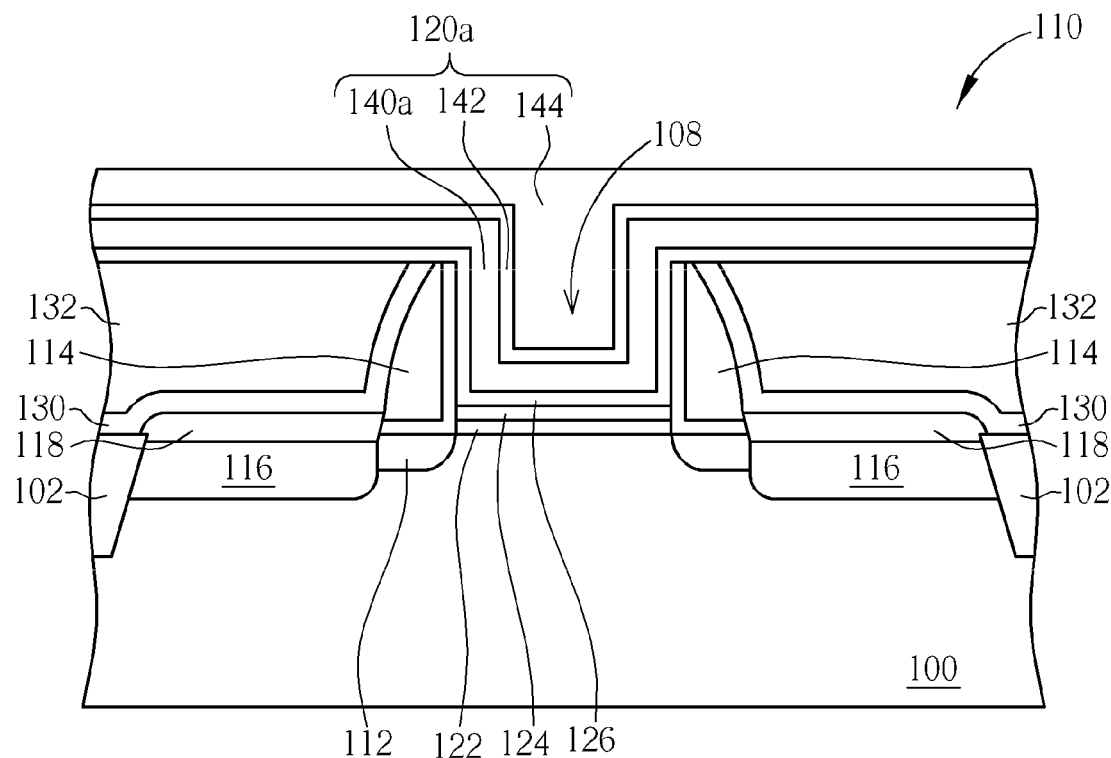

Please refer to FIGS. 5-6. After performing the anneal treatment 150 to form the TiAl$_3$ work function metal layer 140a, a top barrier layer 142 such as a TiN layer is in-situ formed on the TiAl$_3$ work function metal layer 140a. Then, the vacuum environment is removed. Additionally, a titanium oxynitride (TiON) layer serving as the top barrier layer 142 can be formed after removing the vacuum environment. After forming the top barrier layer 142, a low-resistance metal layer 144 filling the gate trench 108 is formed on the substrate 100 and the top barrier layer 142 as shown in FIG. 6. The low-resistance metal layer 144 can be an Al layer, but not limited to this.

Figure 7:
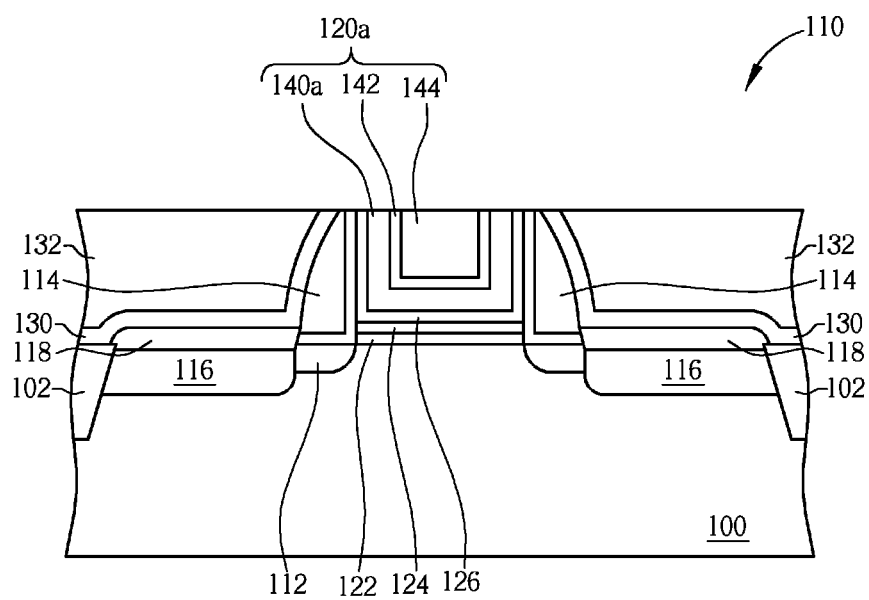

Please refer to FIG. 7. Then, a planarization process such as a chemical mechanical polish (CMP) process is performed to remove unnecessary low-resistance metal layer 144, top barrier layer 142, TiAl$_3$ work function metal layer 140a, and TaN layer 126. Consequently, a metal gate structure 120a is obtained. As shown in FIG. 7, cross-sectional views of the TaN layer 126, the TiAl$_3$ work function metal layer 140a, and the top barrier layer 142 of the metal gate structure 120a respectively include a U-shape according to the preferred embodiment. In addition, the ILD layer 132 and the CESL 130 can be selectively removed and sequentially reformed with a tensile stress on the substrate 100 for improving performance of the semiconductor device 110 in the preferred embodiment. Besides, the above-mentioned silicides 118 can be formed after the ILD layer 132 and the CESL 130 is selectively removed so as not to be damaged by the high temperature of forming the metal gate.

According to the method for manufacturing a metal gate structure provided by the first preferred embodiment, which is integrated with the high-K first process, the anneal treatment 150 is in-situ performed to induce the phase transformation from the TiAl work function metal layer 140 to the TiAl$_3$ work function metal layer 140a, and simultaneously to improve Al diffusion. Accordingly, work function of the metal gate is tuned to the ideal value: 3.9-4.3 eV. In other words, according to the method provided by the first preferred embodiment, a metal gate structure 120a having ideal work function is obtained.

Figure 8:
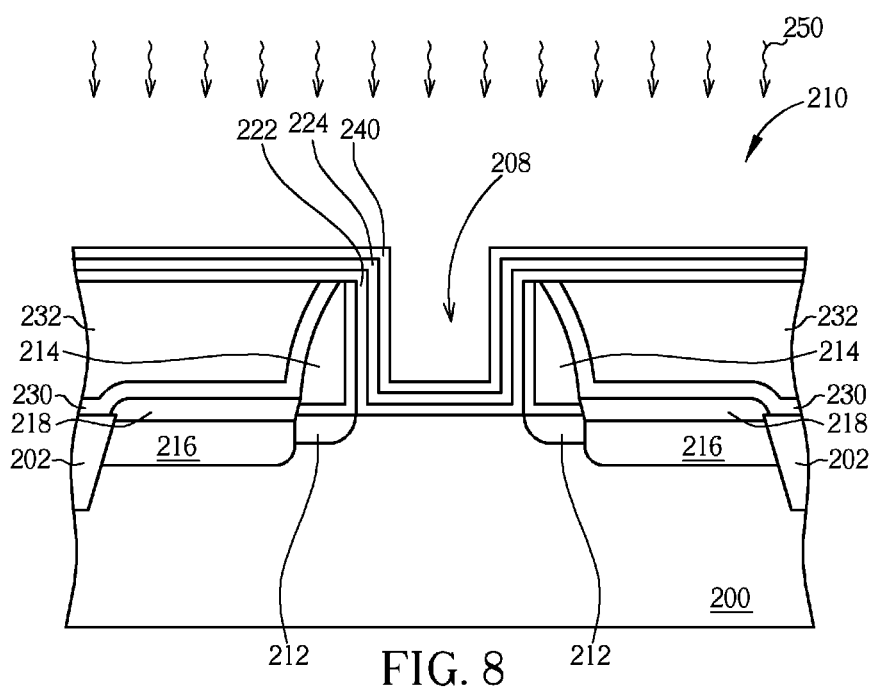
FIGS. 8-10 are schematic drawings illustrating a method for manufacturing a metal gate structure provided by a second preferred embodiment of the present invention.
Figure 9:
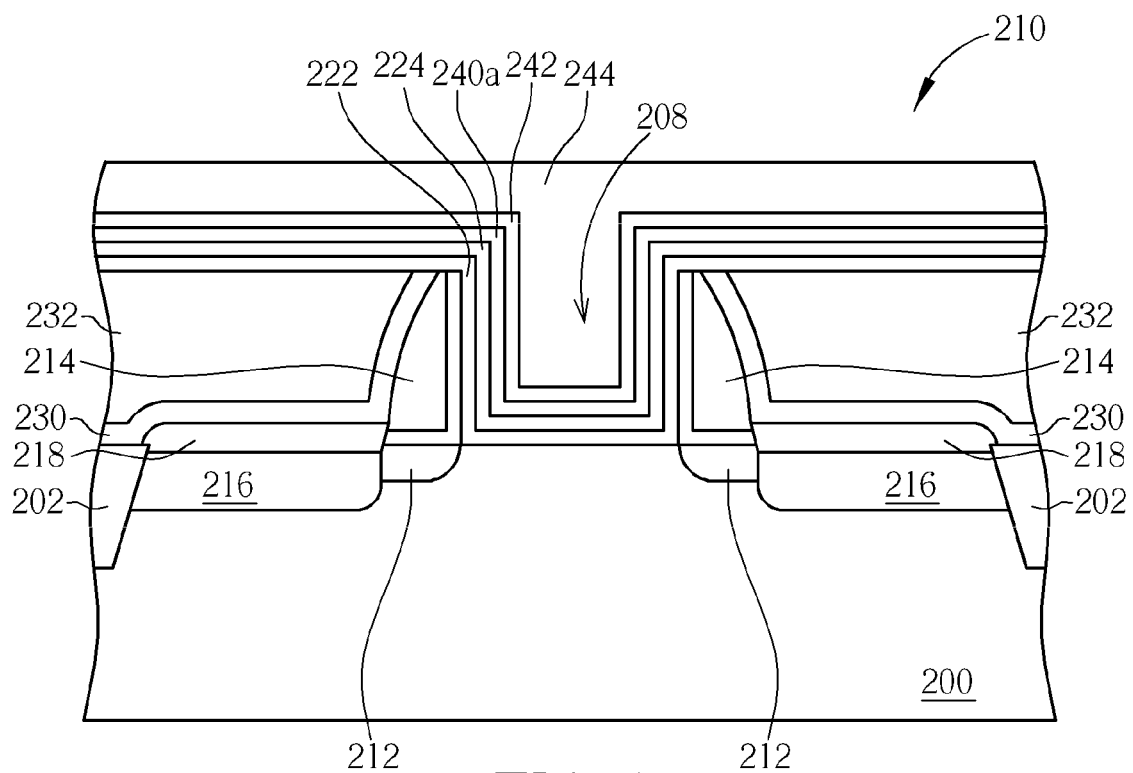
Figure 10:
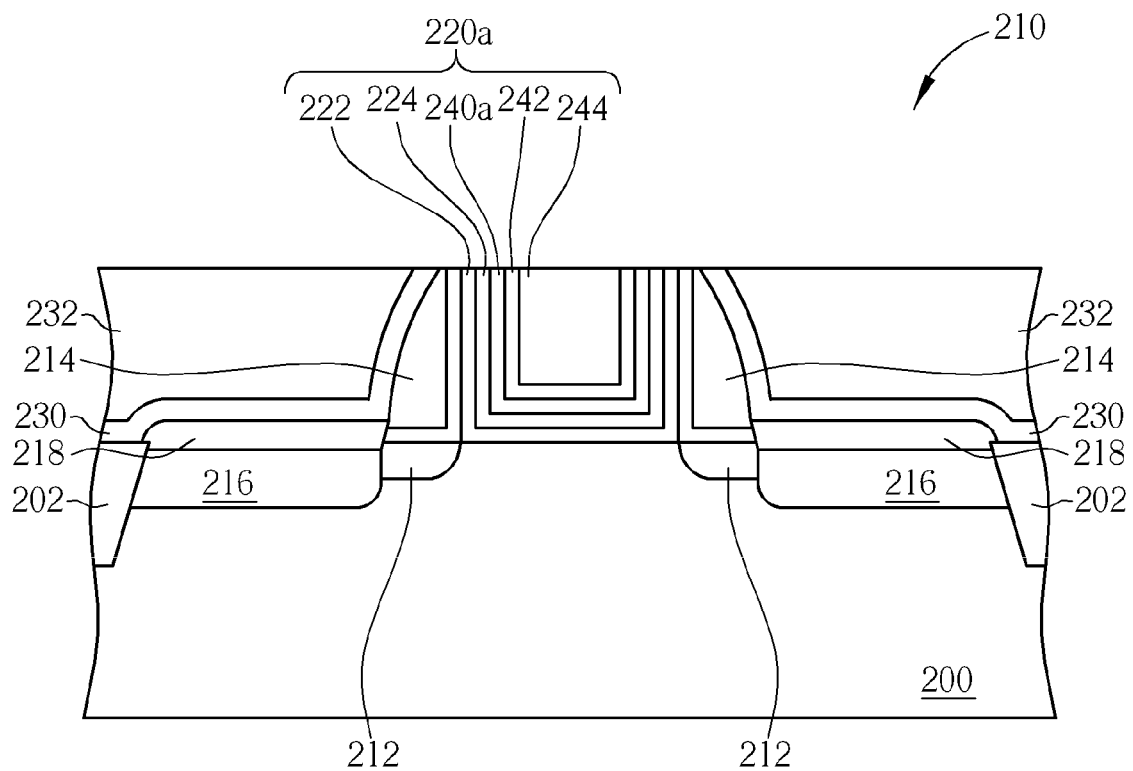

Please refer to FIGS. 8-10, which are schematic drawings illustrating a method for manufacturing a metal gate structure provided by a second preferred embodiment of the present invention. It is noticeable that the preferred embodiment is also performed with the gate-last process. Additionally, material choices for elements the same in both of the first and second preferred embodiment are omitted herein in the interest of brevity.

As shown in FIG. 8, a substrate 200 having a plurality of STI formed therein is provided. The STIs 202 are formed to provide electrical isolation. Next, at least a semiconductor device 210 is formed on the substrate 200. The semiconductor device 210 includes a gate structure (not shown), and the gate structure includes a gate dielectric layer (not shown), a dummy gate (not shown) and a patterned hard mask (not shown). The abovementioned layers are upwardly and sequentially formed on the substrate 200. Furthermore, the gate structure also includes an interfacial layer (not shown) formed prior to the gate dielectric layer. It is noteworthy that the preferred embodiment is integrated with the high-K last process, therefore the gate dielectric layer is preferably a conventional SiO layer.

The semiconductor device 210 further LDDs 212. Since the semiconductor device 210 provided by the preferred embodiment is an n-type semiconductor device, the LDDs 212 are n-type LDDs. The semiconductor device 210 further includes a spacer 214 formed on sidewalls of the gate structure, and the spacer 214 is preferably a multi-layered structure. The semiconductor device 210 further includes an n-type source/drain 216 and silicides 218 for reducing resistance formed on the source/drain 216. As mentioned above, the SEG method can be utilized to form a SiC n-type source/drain 216 according to the preferred embodiment. Furthermore, there are a CESL 230 and an ILD layer 232 sequentially formed on the semiconductor device 210 and the substrate 200. Since steps for forming the gate structure, the LDDs 212, the spacer 214, the source/drain 216, the silicides 218, the CESL 230 and the ILD layer 232 are well-known to those skilled in the art, those details are omitted herein in the interests of brevity.

Please refer to FIG. 8 again. Next, a planarization process is performed to remove a portion of the ILD layer 232, a portion of the CESL 230, and the patterned hard mask. Consequently the top of the dummy gate is exposed. Then, an etching process is performed to remove the dummy gate and the gate dielectric layer to form a gate trench 208. As mentioned above, since the preferred embodiment is integrated with the high-K last process, the gate dielectric layer and the dummy gate are both removed. Accordingly, the substrate 200 or the interfacial layer is exposed in the bottom of the gate trench 208.

Please still refer to FIG. 8. Then, a high-K gate dielectric layer 222, a TiN layer 224 serving as a bottom barrier layer are sequentially formed on the substrate 200 and in the gate trench 208. Additionally, a TaN layer (not shown) can be selectively formed on the TiN layer 224 if required. After forming the TiN layer 224, a TiAl layer 240 serving as a work function metal layer is formed on the substrate 200 and in the gate trench 208. In the preferred embodiment, the TiAl layer 240 is a single-layered structure. However, the work function metal layer 240 can be a Ti/Al bi-layered structure according to the preferred embodiment.

As mentioned above, during forming the work function metal layer, that is the TiAl layer 240 or the Ti/Al bi-layered structure 240, the work function metal layer 240 is formed in a vacuum environment. According to the preferred embodiment, an anneal treatment 250 is in-situ performed to the work function metal layer 240 after forming the TiAl layer 240 without removing the vacuum environment. In other words, the step of forming the work function metal layer 240 and the step of performing the anneal treatment 250 are in-situ performed in a vacuum environment. In the second preferred embodiment, the anneal treatment 250 is performed at a temperature and in a duration the same with those described in the first preferred embodiment, therefore those details are omitted for the sake of simplicity.

As mentioned above, the anneal treatment 250 is performed to the work function metal layer 240 to induce a phase transformation from the TiAl layer 240 to a TiAl$_3$ layer 240a. More important, during the phase transformation from the TiAl work function metal layer 240 to the TiAl$_3$ work function metal layer 240a, Al in the aforementioned layer diffuses to the interface between the TiN layer 224 and the high-K gate dielectric layer 222 and finally arrives at the surface of the high-K gate dielectric layer 222. Simultaneously, work function of the gate structure is tuned. Accordingly, by in-situ performing the anneal treatment 250, Al diffusion is improved, and work function of the n-type metal gate is tuned to the ideal value: 3.9-4.3 eV. Furthermore, since the anneal treatment 250 is performed without removing the vacuum environment, the TiAl layer 240 is avoided from contacting the air, and thus is prevented from forming oxide or nitride that deteriorates the performance.

Please refer to FIG. 9. After performing the anneal treatment 250 to form the TiAl$_3$ work function metal layer 240a, a top barrier layer 242 such as a TiN layer is in-situ formed on the TiAl$_3$ work function metal layer 240a. Then, the vacuum environment is removed. Additionally, a TiON layer serving as the top barrier layer 242 can be formed after removing the vacuum environment. After forming the top barrier layer 242, a low-resistance metal layer 244 filling the gate trench 208 is formed on the substrate 200 and the top barrier layer 242 as shown in FIG. 9. The low-resistance metal layer 244 can be an Al layer, but not limited to this.

Please refer to FIG. 10. Then, a planarization process such as a CMP process is performed to remove unnecessary low-resistance metal layer 244, top barrier layer 242, TiAl$_3$ work function metal layer 240a, bottom barrier layer 224, and high-K gate dielectric layer 222. Consequently, a metal gate structure 220a is obtained. As shown in FIG. 10, cross-sectional views of the high-K gate dielectric layer 222, the bottom barrier layer 224, the TiAl$_3$ work function metal layer 240a, and the top barrier layer 242 of the metal gate structure 220a respectively include a U-shape according to the preferred embodiment. Similarly, the ILD layer 232 and the CESL 230 can be selectively removed and sequentially reformed on the substrate 200 for improving performance of the semiconductor device 210 in the preferred embodiment.

According to the method for manufacturing a metal gate structure provided by the second preferred embodiment, which is integrated with the high-K last process, the anneal treatment 250 is in-situ performed to induce the phase transformation from the TiAl work function metal layer 240 to the TiAl$_3$ work function metal layer 240a and simultaneously improves Al diffusion. Accordingly, work function of the metal gate is tuned to an ideal value: 3.9-4.3 eV. In other words, according to the method provided by the second preferred embodiment, a metal gate structure 220a having ideal work function is obtained.

Accordingly, the present invention provides a method for manufacturing metal gate structure performed with the gate-last process and can be integrated alternatively with high-K first or high-K last process. More important, the provided method utilizes the in-situ performed anneal treatment to induce the phase transformation of the work function metal layer from the TiAl work function metal layer to the TiAl$_3$ work function metal layer. Simultaneously, Al diffusion is improved and thus the work function of the metal gate is tuned to the ideal value: 3.9-4.3 eV. In other word, the method for manufacturing a metal gate structure is performed to provide an n-type metal gate structure having superior reliability Those skilled in the art will readily observe that numerous modifications and alterations of the device and method may be made while retaining the teachings of the invention.

What is claimed is:

1. A method for manufacturing a metal gate structure comprising:

providing a substrate having a high-K gate dielectric layer and a bottom barrier layer sequentially formed thereon;

forming a work function metal layer on the substrate, the work function metal layer comprising a titanium aluminide (TiAl) layer or a Ti/Al bi-layered structure;

performing an anneal treatment to the work function metal layer in-situ to induce a phase transformation of the work function metal layer to form a titanium tri-aluminide (TiAl$_3$) layer, the anneal treatment comprising introducing inert gas;

forming a top barrier layer on the work function metal layer;

forming a low-resistance metal layer on the top barrier layer; and performing a planarization process to form the metal gate structure after forming the low-resistance metal layer, wherein the step of forming the work function metal layer and the step of performing the anneal treatment are in-situ performed in a vacuum environment and the step of forming the top barrier layer is performed after removing the vacuum environment.

2. The method for manufacturing a metal gate structure according to claim 1, wherein the work function metal layer comprises a single-layered structure or a bi-layered structure.

3. The method for manufacturing a metal gate structure according to claim 2, wherein the single-layered structure comprises the titanium aluminide (TiAl) layer.

4. The method for manufacturing a metal gate structure according to claim 2, wherein the bi-layered structure comprises the Ti/Al bi-layered structure.

5. The method for manufacturing a metal gate structure according to claim 1, wherein the anneal treatment is performed at a temperature between 400° C. and 460° C.

6. The method for manufacturing a metal gate structure according to claim 1, wherein the anneal treatment is performed in a duration between 2 minutes and 10 minutes.

7. The method for manufacturing a metal gate structure according to claim 1, wherein the anneal treatment comprises a rapid thermal process (RTP), a Laser-spike annealing, or a furnace.

8. The method for manufacturing a metal gate structure according to claim 1, wherein the top barrier layer is formed between the low-resistance layer and the work function metal layer.

* * * * *